United States Patent
Lee et al.

(10) Patent No.: US 9,355,686 B2
(45) Date of Patent: *May 31, 2016

(54) SEMICONDUCTOR DEVICE WITH MORE THAN ONE TYPE OF MEMORY CELL

(71) Applicant: TAIWAN SEMICONDUCTOR MANUFACTURING COMPANY, LTD., Hsinchu (TW)

(72) Inventors: Cheng Hung Lee, Hsinchu (TW); XiuLi Yang, Shanghai (CN); Liangbo Zhuang, Shanghai (CN)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/597,921

(22) Filed: Jan. 15, 2015

(65) Prior Publication Data

US 2015/0124510 A1    May 7, 2015

Related U.S. Application Data

(63) Continuation of application No. 13/178,021, filed on Jul. 7, 2011, now Pat. No. 8,947,903.

(51) Int. Cl.
*G11C 5/06* (2006.01)
*G11C 8/08* (2006.01)
*G11C 7/12* (2006.01)
*G11C 7/18* (2006.01)
*G11C 11/00* (2006.01)

(52) U.S. Cl.
CPC .. *G11C 5/06* (2013.01); *G11C 7/12* (2013.01); *G11C 7/18* (2013.01); *G11C 8/08* (2013.01); *G11C 11/005* (2013.01)

(58) Field of Classification Search
CPC ........ G11C 16/0483; G11C 7/12; G11C 7/18; G11C 8/08
USPC .......................... 365/63, 185.11, 51, 154, 129
See application file for complete search history.

(56) References Cited

U.S. PATENT DOCUMENTS

| | | | |
|---|---|---|---|
| 7,200,030 B2 | 4/2007 | Yamaoka et al. | |
| 7,499,305 B2 | 3/2009 | Nomura et al. | |
| 8,289,764 B2 | 10/2012 | Hanzawa | |
| 2003/0235071 A1 | 12/2003 | Okazawa | |
| 2004/0125681 A1 | 7/2004 | Yamaoka et al. | |
| 2007/0153565 A1 | 7/2007 | Nomura et al. | |
| 2010/0302882 A1* | 12/2010 | Schmitt ............... | G06F 17/5027 365/189.17 |

* cited by examiner

*Primary Examiner* — Fernando Hidalgo
(74) *Attorney, Agent, or Firm* — Hauptman Ham, LLP

(57) ABSTRACT

A semiconductor chip comprises a word line configured to be driven by a word line driver. The semiconductor chip also comprises a plurality of bit lines. Each bit line of the plurality of bit lines is configured to transmit a signal to a respective bit line amplifier. The semiconductor device further comprises a plurality of memory cells. At least one memory cell of the plurality of memory cells is at an intersection of the word line and a bit line of the plurality of bit lines. The at least one memory cell of the plurality of memory cells is a type selected from at least two memory cell types based on a distance of the intersection from an end of the word line.

20 Claims, 7 Drawing Sheets

SEMICONDUCTOR DEVICE WITH MORE THAN ONE TYPE OF MEMORY CELL

PRIORITY CLAIM

The present application is a continuation of U.S. application Ser. No. 13/178,021, filed Jul. 7, 2011, now U.S. Pat. No. 8,947,903, issued Feb. 3, 2015, which is incorporated herein by reference in its entirety.

BACKGROUND

The electronics industry has an ever growing need for increased memory capacity with reduced power consumption and cost per bit of memory. One way that the cost per bit is reduced is by decreasing the size of the features that make up a semiconductor chip by a process known as "scaling." As the dimensions of semiconductor chips become smaller, however, the operating margins for the devices and structures that form the chips are reduced. Therefore, new methods for designing chips to cope with the reduced margins are desired.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

Figure 1:
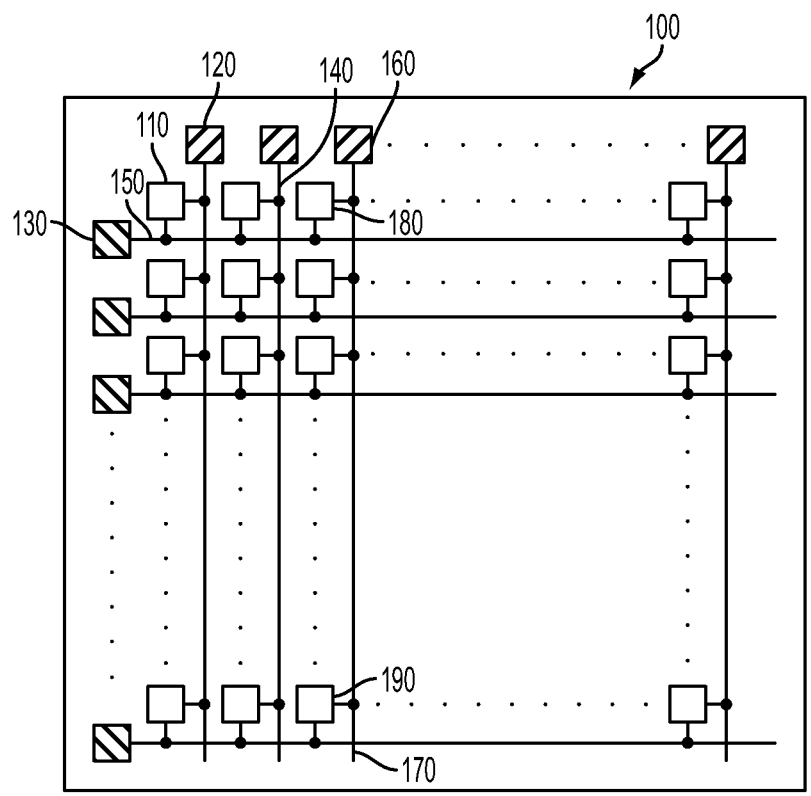
FIG. 1 is a high-level functional schematic diagram of an exemplary semiconductor chip.

FIG. 1 is a high-level functional schematic diagram of an exemplary semiconductor chip 100. The semiconductor memory chip 100 includes various circuit blocks such as, but not limited to, memory cells 110, word line drivers 120 and bit line sense amplifiers/drivers 130. The word line drivers 120 each drive a respective word line 140. The bit line amplifiers/drivers 130 sense or drive respective bit lines 150. The memory cells 110 are each connected across intersections of one of the word lines 140 with one of the bit lines 150.

Each of the memory cells 110 stores one or more bits of information, depending on the kind of memory cell. All known and future developed kinds of memory cell are within the scope of this disclosure.

Read only memory (ROM) cells are programmed with information at the time of manufacture or between manufacture and use in a circuit. An erasable programmable read only memory (EPROM) cell is programmable at any time and is erased using ultraviolet light. In the case of an electrically erasable programmable read only memory (EEPROM), erasure is by electronic means, such EEPROM cells are also used to form Flash memory in the form of NOR or NAND flash. EPROM, EEPROM and Flash are also commonly known as non-volatile memories.

Random access memory (RAM) cells are capable of being reprogrammed at any time. There are two main kinds of RAM cells: static RAM (SRAM) and dynamic RAM (DRAM). SRAM cells store information indefinitely while power is provided, DRAM cells must be refreshed every few milliseconds.

There are also less common non-volatile memory cells that are reprogrammable at any time and perform like RAM. These include memory cells used in phase-change RAM (PRAM), ferroelectric RAM (FeRAM), resistive RAM (RRAM) and magnetic RAM (MRAM).

In some embodiments, one of the above kinds of memory cell is arranged in memory arrays like that shown in FIG. 1. In such arrays, the memory cells 110 are of the same design type. For example, memory cells 110 are each a ROM kind of memory cell and, in addition, the dimensions and specifications of the components forming each memory cells are the same. If the memory cells 110 are of the same design then waveforms applied to the word lines 140 and bit lines 150 enables reading and writing of data to a memory cell no matter which cell in the memory chip is accessed. The above situation is true if the waveforms generated for word line 140 or bit line 150, are similar at all points along the word line or bit line. As semiconductor chips have become smaller, the width of the wiring, i.e., comprising word lines 140 and bit lines 150 has become smaller and the speed at which signals travel along the word lines 140 and bit lines 150 has increased. Moreover, the variability of these lines relative to the width and length of the lines has increased. This increase in variability has also occurred for the memory cells 110. Therefore, the margins within which all memory cells 110 of the memory chip 100 will work satisfactorily have become smaller.

Moreover, the signals along word line 140 or bit line 150 are not necessarily similar. As the signals travel along the wires, the signals become distorted due to the resistance and capacitance of the wire comprising the word lines 140 and bit lines 150, as well as the load capacitance of the memory cells 110. Therefore, for example, the signal produced by word line driver 160, is distorted by the time the signal reaches the end of the word line 170. Consequently, memory cells 180 and 190 receive different signals. In recent memory chip designs, a memory cell design that responds reliably to the signal received by, for example, memory cell 180 does not enable memory cell 190, with the same design, to respond reliably to the signal at the end of the word line 170. Alternatively, a cell design that responds reliably to the signal received by, for example, memory cell 190 does not enable memory cell 180, with the same design, to respond reliably to the signal produced by word line driver 160. Because of the reduced margins discussed above, there is also no single memory cell design that responds correctly and reliably to both the example signals received by memory cells 180 and 190. These same issues apply to signals produced by bit line amplifiers/drivers 130 to write to a memory cell 110 along bit line 150. Moreover, the above issues apply to signals produced by a particular memory cell 110 for transmission to a bit line amplifier/driver 130. A memory cell design that produces an acceptable signal for the bit line amplifier/driver 130 if the memory cell 150 is located close to a respective amplifier/driver 130 may be unacceptable for the amplifier/driver 130 when the memory cell 110 producing the signal is located at the far end of bit line 150.

Figure 2:
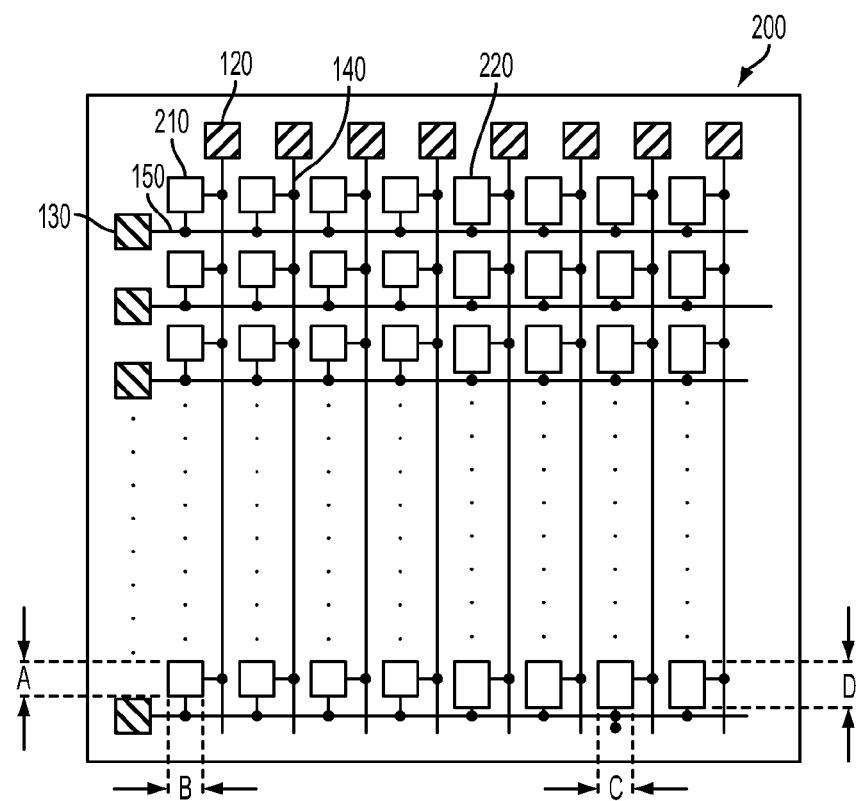
FIG. 2 is a high-level functional schematic diagram of an example of a semiconductor memory with modified memory cells used for a portion of the memory cells according to an embodiment.

FIG. 2 is a high-level functional schematic diagram of an example of a semiconductor memory 200 with a first type of memory cell 210 and a second type of memory cell 220 used for separate portions of the semiconductor memory 200 in place of memory cells 110 used in semiconductor memory 100. In some embodiments, the first type of memory cell and second type of memory cell are different implementations of one of the kinds of memory cell discussed above. For example, the first type of memory cell and second type of memory cell are ROM memory cells but with different designs. The second type of memory cells 220 are placed between intersections of the word lines 140 and bit lines 150 for which the number of intersections between the intersection and the respective bit line amplifier/driver is greater than half the total number of intersections along the respective bit line 150. The second type of memory cells 220 have a different design with respect to the first type of memory cell 210. Therefore, in the given chip design the design of the type of memory cell is optimized to receive or transmit signals along less than half the bit line length to the respective bit line amplifier/driver 130. The design of the second type of memory cell 220 is optimized to receive or transmit signals along more than half the bit line length to the respective bit line amplifier/driver 130. Thus, more than one type of memory cell design is used based on the position along the bit line 150 of a given memory.

The type of memory cell selected at a given intersection of word lines 140 and bit lines 150 changes at the mid point of bit line 150. In other embodiments, the distance along bit line 150 that the memory cell design changes is at any point along the bit line 150, for example ¼ of the total length of the bit line 150 or ¾ of the total length of the bit line 150. In some embodiments, only the first memory cell along bit line 150 is a first type of memory cell 210. In some embodiments, only the last memory cell farthest from the bit line amplifier/driver 130 is a second type of memory cell 220. Selecting the first or last cell is advantageous to prevent reflections of signals at the end of bit line 150 or word line 140 by matching the impedance at the end of bit line or word line.

In some embodiments, more than two types of memory cell are located along any bit line 150. For example, the first type of memory cell for the first ⅓ of the bit line 150, the second type of memory cell for the second ⅓ of the bit line 150 and a third type of memory cell for the final ⅓ of bit line 150. In some embodiments, the number of types of memory cell along a given bit line 150 ranges from one to the number of memory cells on the bit line 150. Further, in some embodiments the number of transition points from one type of memory cell to another type of memory cell is any where from zero, to one less than the number of memory cells in bit line 150.

In one or more of above embodiments, the type of memory cell changes as the distance along bit line 150 increases. In some embodiments, the type of memory cell changes as the intersection of the memory cell is located farther from word line driver 120. In those embodiments, variation in the signals transmitted by the word line drivers 120 along the word lines 140 is compensated for in the same manner discussed above for the bit line signals. In some embodiments, the number of types of memory cell along a given word line 140 is from one, up to the number of memory cells on word line 140. Further, in some embodiments the number of transition points from one type of memory cell to another type of memory cell ranges from zero to one less than the number of memory cells in word line 140.

In some embodiments, the type of memory cell changes in relation to both the distance along word line 140 and the distance along bit line 150. Thus, some embodiments include combinations of the above embodiments for numbers and positions of types of memory cell along word lines 140, with the above embodiments for numbers and positions of types of memory cell along bit lines 150. Thus, for example in some embodiments every memory cell in the memory chip is a unique type of memory cell.

In some embodiments, the different types of memory cells are characterized by occupying different cell areas on the surface of the semiconductor chip 100.

For example, the area of the second type of memory cell 220 is larger than the first type of memory cell 210. In some embodiments a channel width of a transistor used in the second type of memory cell 220 is wider than the channel width of a transistor in the first type of memory cell 210 resulting in the different memory cell areas. Alternatively, the channel length of the second type of memory cell 220 is longer than the channel length of the first type of memory cell 210. In order to not waste chip area first and second types of memory cell 220 and 210 are sized to include all devices necessary to function, with minimal unused chip area. Therefore, a change in the area of a device in the second type of memory cell 220 leads to a change in area of the second type of memory cell 220 unless the additional area used by that device is compensated for by a corresponding reduction in area of another device in the second type of memory cell 220.

In the above embodiments, the input capacitance, output capacitance, resistance and drive capability of the type of memory cell are adjustable to correspond to the word line and bit line signals by varying channel widths and lengths.

Figure 3:
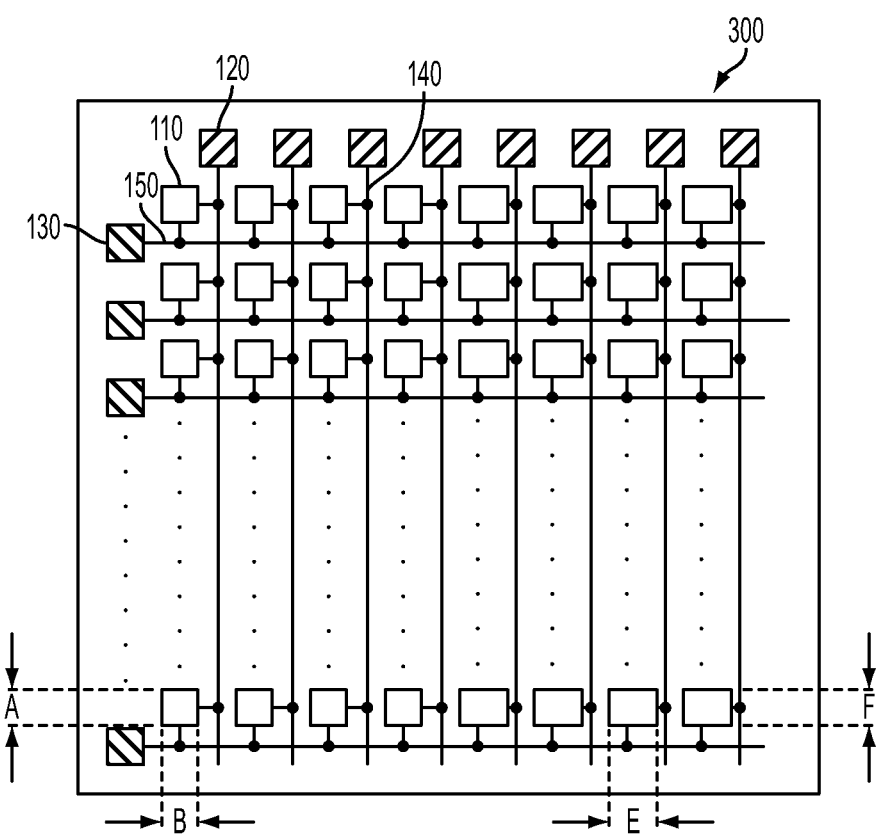
FIG. 3 is a high-level functional schematic diagram of an example of a semiconductor memory with modified memory cells used for a portion of the memory cells according to an embodiment.

In some embodiments, the area of the second type of memory cell 220 is larger than that of the first type of memory cell 210 because the dimension of the second type of memory cell 220 longer in a direction parallel to the word lines 140. Alternatively, the area of the second type of memory cell 220 is larger than that of the first type of memory cell 210 because the dimension of the second type of memory cell 220 longer in a direction parallel to the bit lines 150, e.g., FIG. 3 for memory chip 300. In some embodiments, the area of the second type of memory cell 220 is larger because the dimensions of the second type of memory cell 220 is larger in both the word line 140 and bit line directions compared with the first type of memory cell 210.

In some embodiments, the types of memory cell are rectangular, with the sides of the rectangle parallel to at least one of bit line 150 or word line 140. In some embodiments, the types of memory cell are any shape that is capable of tiling a plane. Examples of shapes that tile a plane include rectangles, equilateral triangles and regular hexagons.

In some embodiments, the area of the second type of memory cell 220 is at least 10% greater than the area of the first type of memory cell 210.

In some embodiments, the type of memory cell selected for memory cells 150 closer to word line driver 120 or bit line amplifier/driver 130 are larger in area than types of memory cells farther from word line driver 120 or bit line amplifier/driver 130. The area difference of the memory cell types is generated in a similar manner to that discussed above.

Figure 4:
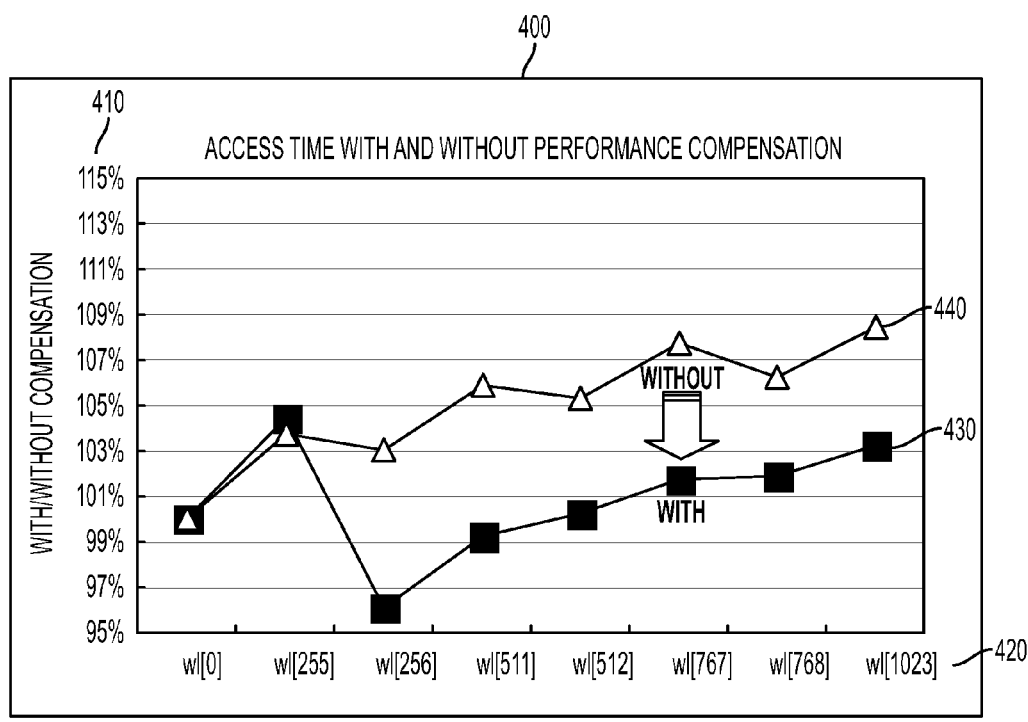
FIG. 4 is an example of the enhanced performance achieved by using the embodiments shown in FIG. 2 or 3.

FIG. 4 is a graph 400 of the performance of a prior known memory chip and a memory chip with different area memory cells as discussed above. The access time, as a percentage of the access time of an ideal memory cell, is on the y-axis 410 and the word line number is on the x-axis 420. In prior known memory chips not employing cell with different areas, graph line 430 is the access time, meeting the required access time for low word line numbers. As the word line number increases, the access time becomes worse, rising above 108%. Graph line 440 depicts the memory chip with different area memory cells performing better for memory cell with high word line numbers.

The above embodiments address changes in the dimensions of devices in a memory cell. In some embodiments, the process steps used to fabricate the memory chip are modified to produce types of memory cell 150. In some embodiments, the different types of memory cell have different voltage levels or current levels to access the memory cell 150 for reading, writing or refresh.

Figure 5:
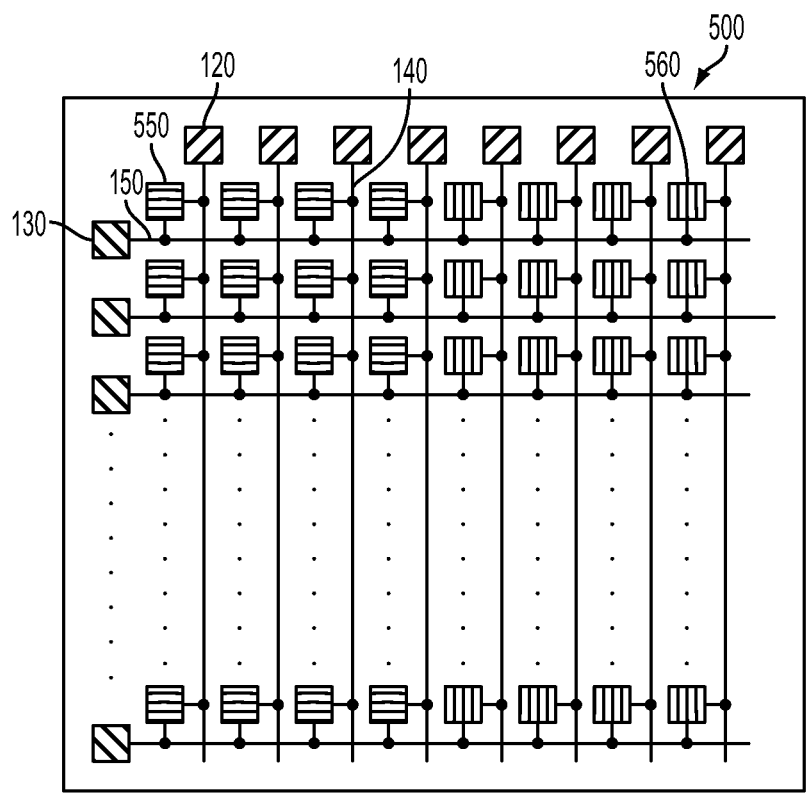
FIG. 5 is a high-level functional schematic diagram of an example of a semiconductor memory with modified memory cells used for a portion of the memory cells according to an embodiment.

FIG. 5 is an embodiment of a memory chip 500, with two types of memory cell. In this embodiment, the two types of memory cells 550 and 560 do not have different areas. In some embodiments, the threshold voltage of a device in the type of memory cell 550 is different from a threshold voltage of a corresponding device in the type of memory cell 560. In some embodiments, this difference in threshold voltage is manufactured by, for example, a difference in doping concentrations in a channel of the device, different materials used in a gate or a gate oxide material of the device, or any other method known or future developed for manipulating the threshold voltage of the device.

Figure 6:
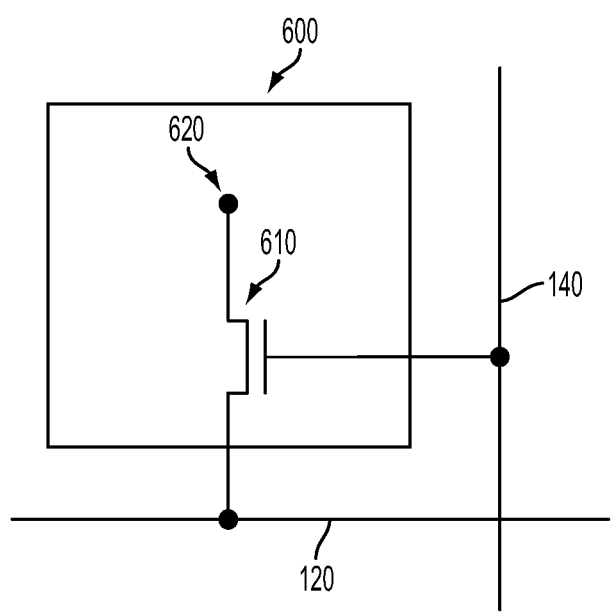
FIG. 6 is a high-level functional schematic diagram of memory cells according to an embodiment.

FIG. 6 is an embodiment of a device 610 in a memory cell 600 in which the device is a MOSFET transistor. In this embodiment the gate is connected to the word line 140. When the word line 140 is enabled or driven the MOSFET transistor 610 switches on allowing the value of data on terminal 620 to be transmitted along bit line 150. In embodiments that correspond to a ROM, terminal 620 is connected to for example a power line, the power line connected determining the stored data value. In some ROM embodiments the stored data value is determined by terminal 620 being floating or connected to a power line. In embodiments that correspond to a DRAM, terminal 620 is connected to a capacitor that stores the data value. In embodiments that correspond to a Flash, EPROM or EEPROM, terminal 620 is connected to a power line or another memory cell. A floating gate in the MOSFET transistor 610 or alternatively an insulating layer in a gate insulator of the MOSFET transistor 610 stores the data value. Similarly, in FeRAM embodiments a ferroelectric gate layer in MOSFET transistor 610, or alternatively, a ferroelectric capacitor connected to terminal 620 stores the data value. In PRAM and RRAM embodiments the value of a resistor connected to terminal 620 stores the data value.

Due to the different threshold voltages of memory cells 550 and 560, the word line voltage switches the MOSFET transistor 610 in the different types of memory cell on at different voltage levels. Thus, by selecting either memory cells 550 or 560, the differing levels of the word line voltage at different portions of the word line 140 are compensated for in a manner similar to the different area types of memory cells 210 and 220 described above.

Figure 7:
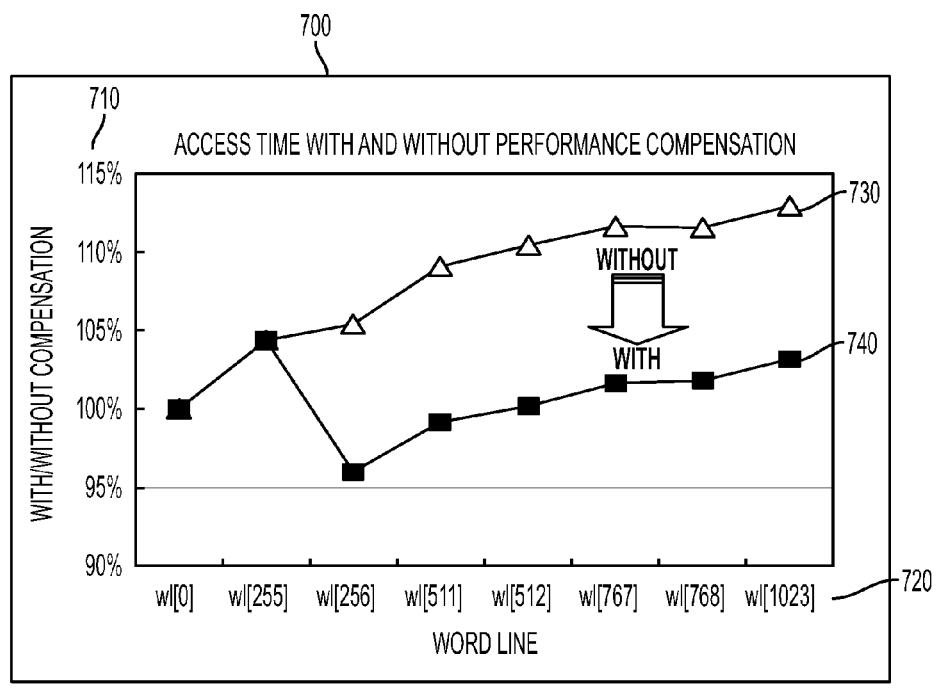
FIG. 7 is an example of the enhanced performance achieved by using the embodiments shown in FIGS. 5 and 6.

FIG. 7 is a graph 700 showing the performance of a prior known memory chip and a memory chip with different threshold memory cells as discussed above. The access time, as a percentage of the access time an idea memory cell, is depicted on the y-axis 710 and the word line number is depicted on the x-axis 720. In prior known memory chip not employing memory cells with different areas, the access time meets the required access time for low word line numbers as shown by results 730. As the word line number increases, the access time becomes worse, rising above 112%. The memory chip with different threshold memory cells performs far better for memory cells with high word line numbers, as shown by results 740.

In some embodiments, the threshold voltage of the type of memory cell selected is reduced as the memory cell becomes farther from word line driver 120. Therefore, a lower voltage is required to enable memory cells farther from the word line driver 120. In other embodiments the threshold voltage of the type of memory cell selected is increased as the memory cell becomes farther from word line driver 120. Therefore, a higher voltage is required to enable memory cells farther from the word line driver 120. In some embodiments the difference in threshold voltage between two memory cell types is at least 100 mV.

In some embodiments, the memory cells have a threshold voltage that changes the voltage level on bit line 150 required to read or write data to a cell, rather than the voltage level on word line 140. In some embodiments the memory cell types include combinations of memory cell types that require differing levels of the word line voltage and memory cell types that require differing levels of the bit line voltage.

In some embodiments the types of memory used at intersections in the memory chip may vary in area type or threshold type or a combination of area type and threshold type, the selected memory type at each intersection optimizing the memory cell at that intersection for the word line and bit line signals at that intersection.

An aspect of this description relates to a semiconductor chip. The semiconductor chip comprises a word line configured to be driven by a word line driver. The semiconductor chip also comprises a plurality of bit lines. Each bit line of the plurality of bit lines is configured to transmit a signal to a respective bit line amplifier. The semiconductor device further comprises a plurality of memory cells. At least one memory cell of the plurality of memory cells is at an intersection of the word line and a bit line of the plurality of bit lines. The at least one memory cell of the plurality of memory cells is a type selected from at least two memory cell types based on a distance of the intersection from an end of the word line.

Another aspect of this description relates to a semiconductor chip. The semiconductor chip comprises a plurality of word lines configured to be driven by respective word line drivers. The semiconductor chip also comprises a bit line configured to transmit a signal to a bit line amplifier. The semiconductor chip further comprises a plurality of memory cells. At least one memory cell of the plurality of memory cells is at an intersection of a word line of the plurality of word lines and the bit line. The at least one memory cell is a type selected from at least two memory cell types based on a distance of the intersection from an end of the bit line.

A further aspect of this description relates to a semiconductor chip. The semiconductor chip comprises a plurality of word lines configured to be driven by respective word line drivers. The semiconductor chip also comprises a plurality of bit lines configured to transmit signals to respective bit line amplifiers. The semiconductor chip further comprises a plurality of memory cells. At least one memory cell of the plurality of memory cells is at an intersection of a word line of the plurality of word lines and a bit line of the plurality of bit lines. The at least one memory cell is a type selected from at least two memory cell types based on a quantity of intersections between the intersection and the bit line amplifier respectively associated with the bit line of the plurality of bit lines.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor chip comprising:
   a word line configured to be driven by a word line driver;
   a plurality of bit lines, each bit line of the plurality of bit lines being configured to transmit a signal to a respective bit line amplifier; and
   a plurality of memory cells,
   wherein at least one memory cell of the plurality of memory cells is at an intersection of the word line and a bit line of the plurality of bit lines, and the at least one memory cell of the plurality of memory cells is a type selected from at least two memory cell types based on a distance of the intersection from an end of the word line.

2. The semiconductor chip of claim 1, wherein each of the at least two memory cell types have different cell areas.

3. The semiconductor chip of claim 2, wherein the memory cell type selected for the at least one memory cell at the intersection is based on a quantity of intersections between the intersection and the respective bit line amplifier.

4. The semiconductor chip of claim 3, wherein the areas of the memory cell types increase with an increase in the quantity of intersections between the intersection and the respective bit line amplifier.

5. The semiconductor chip of claim 2, a first memory cell type and a second memory cell type of the at least two memory cell types are rectangular, the first memory cell type and the second memory cell type have equal lengths in a direction parallel to a direction in which the word line extends.

6. The semiconductor chip of claim 2, wherein a first memory cell type and a second memory cell type of the at least two memory cell types differ in area by at least 10%.

7. The semiconductor chip of claim 1, wherein a first memory cell type and a second memory cell type of the at least two memory cell types each include a semiconductor device, and the semiconductor device of the first memory cell type has a corresponding threshold voltage different from the semiconductor device of the second memory cell type.

8. The semiconductor chip of claim 7, wherein the threshold voltage of the first memory cell type is at least 100 mV greater than the threshold voltage of the second memory cell type.

9. A semiconductor chip comprising:
   a plurality of word lines configured to be driven by respective word line drivers;
   a bit line configured to transmit a signal to a bit line amplifier; and
   a plurality of memory cells,
   wherein at least one memory cell of the plurality of memory cells is at an intersection of a word line of the plurality of word lines and the bit line, and the at least one memory cell is a type selected from at least two memory cell types based on a distance of the intersection from an end of the bit line.

10. The semiconductor chip of claim 9, wherein a first memory cell type and a second memory cell type of the at least two memory cell types are rectangular, the first memory cell type and the second memory cell type have equal lengths in a direction parallel to a direction in which the bit line extends, and each of the at least two memory cell types have different cell areas.

11. The semiconductor chip of claim 9, wherein a first memory cell type and a second memory cell type of the at least two memory cell types are rectangular, the first memory cell type and the second memory cell type have equal lengths in a direction parallel to a direction in which the word lines of the plurality of word lines extend, and each of the at least two memory cell types have different cell areas.

12. The semiconductor chip of claim 9, wherein the memory cells of the plurality of memory cells are of a first memory cell type or a second memory cell type, and about 75% of the memory cells of the plurality of memory cells are of the first memory cell type.

13. The semiconductor chip of claim 12, wherein the memory cells of the plurality of memory cells having the first memory cell type are at consecutive intersections along a length of the bit line.

14. The semiconductor chip of claim 9, wherein a first memory cell type and a second memory cell type of the at least two memory cell types each have a channel length, and the semiconductor device of the first memory cell type has a corresponding channel length different from the semiconductor device of the second memory cell type.

15. A semiconductor chip comprising:
    a plurality of word lines configured to be driven by respective word line drivers;
    a plurality of bit lines configured to transmit signals to respective bit line amplifiers; and
    a plurality of memory cells,
    wherein at least one memory cell of the plurality of memory cells is at an intersection of a word line of the plurality of word lines and a bit line of the plurality of bit lines, and the at least one memory cell is a type selected from at least two memory cell types based on a quantity of intersections between the intersection and the bit line amplifier respectively associated with the bit line of the plurality of bit lines.

16. The semiconductor chip of claim 15, wherein a first memory cell type and a second memory cell type of the at least two memory cell types each have a channel width, and the semiconductor device of the first memory cell type has a corresponding channel width different from the semiconductor device of the second memory cell type.

17. The semiconductor chip of claim 15, wherein the memory cells of the plurality of memory cells are of a first memory cell type along the bit line of the plurality of bit lines for a first ¼ of a length of the bit line of the plurality of bit lines and the memory cells of the plurality of memory cells are of a second memory cell type for a remainder of the length of the bit line of the plurality of bit lines.

18. The semiconductor chip of claim 17, wherein the first memory cell type has a first threshold voltage, and the second memory cell type has a second threshold voltage different from the first threshold voltage.

19. The semiconductor chip of claim 17, wherein the first memory cell type has a first area, and the second memory cell type had a second area different from the first area.

20. The semiconductor chip of claim 17, wherein the first ¼ of the length of the bit line of the plurality of bit lines begins at a side of the bit line of the plurality of bit lines coupled with the bit line amplifier respectively associated with the bit line of the plurality of bit lines.

* * * * *